United States Patent
Kojima

(10) Patent No.: US 7,741,894 B2
(45) Date of Patent: Jun. 22, 2010

(54) OUTPUT CIRCUIT

(75) Inventor: Masaki Kojima, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 10/948,439

(22) Filed: Sep. 24, 2004

(65) Prior Publication Data

US 2005/0077948 A1    Apr. 14, 2005

(30) Foreign Application Priority Data

Oct. 14, 2003    (JP)    ............................. 2003-353174

(51) Int. Cl.
*H03K 17/687*    (2006.01)
(52) U.S. Cl. ...................... 327/427; 327/434
(58) Field of Classification Search ............... 361/56; 327/108, 109, 110, 111, 112, 427, 434, 374, 327/376, 377; 326/85, 87
See application file for complete search history.

(56) References Cited

U.S. PATENT DOCUMENTS

| | | | | |
|---|---|---|---|---|
| 4,117,353 | A * | 9/1978 | Butler et al. ................. | 327/538 |
| 5,742,183 | A * | 4/1998 | Kuroda ......................... | 326/81 |
| 5,742,193 | A * | 4/1998 | Colli et al. .................... | 327/170 |
| 5,757,214 | A * | 5/1998 | Stoddard et al. ............. | 327/110 |
| 5,910,738 | A * | 6/1999 | Shinohe et al. .............. | 327/108 |
| 6,100,728 | A * | 8/2000 | Shreve et al. ................ | 327/110 |
| 6,127,862 | A * | 10/2000 | Kawasumi .................... | 327/112 |
| 6,229,355 | B1 * | 5/2001 | Ogasawara ................... | 327/108 |
| 6,300,798 | B1 * | 10/2001 | Possley ......................... | 326/83 |
| 6,400,106 | B1 | 6/2002 | Magruder et al. | |
| 6,411,133 | B1 * | 6/2002 | Matsudai et al. .............. | 327/65 |
| 6,462,587 | B2 * | 10/2002 | Yano ............................. | 327/89 |
| 6,556,407 | B2 | 4/2003 | Brando et al. | |
| 6,661,260 | B2 | 12/2003 | Nakahara et al. | |
| 2004/0021498 | A1 * | 2/2004 | Scheikl ......................... | 327/427 |

FOREIGN PATENT DOCUMENTS

| | | |
|---|---|---|
| CN | 1004184 B | 5/1989 |
| CN | 1391350 A | 1/2003 |
| DE | 19855370 A1 | 12/1998 |
| DE | 19855604 C1 | 12/1998 |
| JP | 04-172962 | 6/1992 |
| JP | 05-268023 | 10/1993 |

(Continued)

OTHER PUBLICATIONS

Japanese Office Action dated Nov. 10, 2008 with Partial English-Language Translation.

(Continued)

*Primary Examiner*—Lincoln Donovan
*Assistant Examiner*—Khareem E Almo
(74) *Attorney, Agent, or Firm*—McGinn IP Law Group, PLLC

(57) ABSTRACT

An output circuit having an output transistor which switches a load current is disclosed. The output circuit includes a load current detecting block which detects a current level of the load current, and a slew rate adjustment block which adjusts a slew rate during a turn-off transition of the output transistor in response to a result of the detection by the load current detecting block.

11 Claims, 3 Drawing Sheets

FOREIGN PATENT DOCUMENTS

| | | |
|---|---|---|
| JP | 06-066701 | 3/1994 |
| JP | 11-346147 | 12/1999 |
| JP | 2000-295838 | 10/2000 |
| JP | 2002-095151 | 3/2002 |
| JP | 2002-290221 | 10/2002 |
| JP | 2002-290221 A | 10/2002 |
| JP | 2003-198277 | 7/2003 |
| JP | 2003-198277 A | 7/2003 |
| JP | 2003-524921 | 8/2003 |
| WO | WO 00/27032 | 5/2000 |

OTHER PUBLICATIONS

Japanese Office Action dated Nov. 10, 2008 (with partial English translation).

Japanese Office Action dated Mar. 26, 2009 with a partial English language translation.

* cited by examiner

OUTPUT CIRCUIT

BACKGROUND OF THE INVENTION

1. Field of the Invention

This invention relates to an output circuit, specifically, an output circuit having slew rate adjustment circuits.

2. Description of Related Art

Output circuits generally have a power MOS transistor, and control the switching of the power source to the load. In the output circuits, a sudden transition of the switching element causes the voltage variation due to the inductance components on the line or the like. Accordingly, the output circuits usually have a slew rate adjustment circuit which adjusts the slew rates during the turn-on and turn-off transitions. The slew rate is defined as the speed of the voltage variation during the transition in the switching element. For example, the slew rate during the turn-off transition is set relatively low so that the excessive high switching speed would not degrade the stability of the circuit operation.

Japanese Unexamined Patent Application Publication No. H11-346147 discloses an output circuit which has a slew rate adjustment circuit. FIG. 3 shows the arrangement of the output circuit described in the reference above. At the time when an input pulse signal Vi ramps up to High level from Low level, the P-channel transistor Q21 is turned on. This allows the gate terminal of the output transistor (hereafter referred to as output MOS) 21 to be charged by the constant current source CS21. The gate voltage of the output MOS21 rises and then the output MOS21 is turned on. The rise speed of the voltage is determined by the current value of the constant current source CS21. That is, in the output circuit 20, the slew rate during the turn-on transition is set according to the current value of the constant current source CS21.

On the other hand, at the time when the input pulse signal Vi ramps down to Low level from High level, the N-channel transistor Q22 is turned on. This allows the constant current source CS22 to discharge the electrical charge having been accumulated at the output MOS21. The gate voltage of the output MOS21 falls and then the output MOS21 is turned off. The fall speed of the voltage is determined by the current value of the constant current source CS22. That is, in the output circuit 20, the slew rate during the turn-off transition is set according to the current value of the constant current source CS22.

By the way, the output circuits usually have a protection circuit which avoids the persistent excessive current on the output MOS21. When such a protection circuit detects the excessive current state, the input pulse signal Vi is forced to drop to Low level and the output MOS21 is turned off. When an excessive current occurs at the output MOS21, the output MOS21 is under the stress corresponding to the energy that would be generated during the time between the beginning of the occurrence of the excessive current and the completion of the turn-off of the output MOS21. In this case, if the slew rate during the turn-off transition is low enough not to degrade the stability of the circuit operation, the forward safe operation area (SOA) of the output MOS21 may be exceeded, which causes a danger of the destruction of the output MOS21.

In the circuit 20, also when the output MOS21 is forced to be turned off by the protection circuit, the MOS21 is turned off at a slew rate for the turn-off transition which is determined based on the current value of the second constant current source CS22. In view of the protection for the output MOS21, a higher slew rate during the turn-off transition is preferable. But, as described above, so high a slow rate causes the problem of degradation in the stability of the circuit operation when the rated current is passed through the output MOS21. In other words, in the conventional output circuit 20, there is a tradeoff between ensuring the protection of the output MOS21 and improving the stability of the circuit operation. Thus, the effective protection of the output MOS21 and the adequate improvement of the stability of the circuit operation have not been compatible.

SUMMARY OF THE INVENTION

An object of the present invention is to provide an output circuit which is able to ensure the protection of the switching elements and, at the same time, improve the stability of the circuit operation.

An output circuit having an output transistor which switches a load current comprises a load current detecting block which detects a current level of the load current, and a slew rate adjustment block which adjusts a slew rate during a turn-off transition of the output transistor in response to a result of the detection by the load current detecting block.

Further, it is preferable the slew rate adjustment block adjusts the slew rate during a turn-off transition according to a current value when discharging a gate voltage of the output transistor.

According to the output circuit of the present invention, a slew rate adjustment block sets the slew rate during the turn-off transition of the output transistor according to the load current value which is detected by a load current detecting block. For example, during the turn-off transition of the output transistor, if the load current is large, a high slew rate is set so that the output transistor can be turned off instantaneously. On the other hand, if the load current is small, a low slew rate is set so that the output transistor can be turned off gradually. Thus, with ensuring the effective protection of the switching elements of the output circuit, the improvement of the stability in the circuit operation is achieved.

According to the output circuit of the present invention, the load current detecting block can employ the configuration in which the current level of the load current is detected based on the voltage drop across the output transistor.

According to the output circuit of the present invention, the slew rate adjustment block sets the slew rate according to the load current value which is detected by the load current detecting block at the turn-off transition of the output transistor. Therefore, with ensuring the effective protection of the switching elements of the output circuit, the improvement of the stability in the circuit operation is achieved.

The above and other objects, features and advantages of the present invention will become more fully understood from the detailed description given hereinbelow and the accompanying drawing which are given by way of illustration only, and thus are not to be considered as limiting the present invention.

DESCRIPTION OF THE PREFERRED EMBODIMENTS

Figure 1:
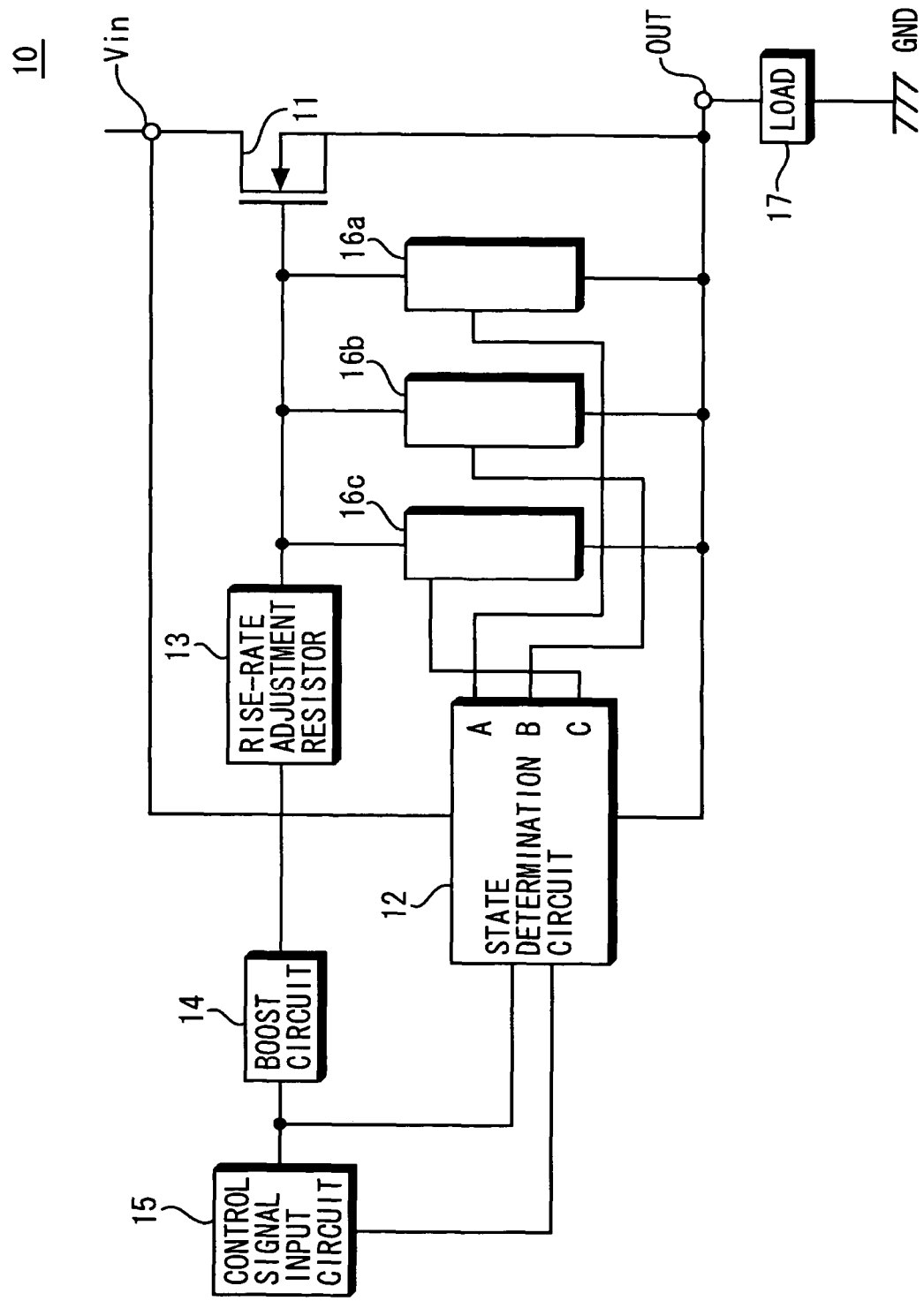
FIG. 1 is a circuit diagram showing the output circuit of an embodiment of the present invention.

The present invention is explained in further detail by reference to the drawings. FIG. 1 is the output circuit showing the first embodiment of the present invention. The output circuit 10 comprises an output MOS11, a state determination circuit 12, a rise-rate adjustment resistor 13, a boost circuit 14, control signal input circuit 15, and a plurality of slew rate adjustment circuits 16 (16a, 16b, 16c) for the turn-off transition. A power source terminal Vin of the output circuit 10 is applied, with power source voltage from a battery, and a load 17 is connected to an output terminal OUT. The output MOS11 is configured by an N-channel MOS transistor. The drain terminal of the output MOS11 is connected to the power source terminal Vin, and the source terminal is connected to the output terminal OUT. The gate terminal of the output MOS11 is connected to the boost circuit 14 via the rise-rate adjustment resistor 13. The gate terminal of the output MOS is, via the rise-rate adjustment resistor 13, fed with boosted voltage from the boost circuit 14. The boost circuit 14 is operated based on the control signal fed from the control signal input circuit 15. The boosted voltage from the boost circuit 14 is larger than the sum voltage of the power source voltage applied to the power source terminal Vin and the threshold voltage Vt1 of the output MOS11.

The control signal input circuit 15 receives an external signal for the switching control of the output MOS11. Based on the external signal, the control signal input circuit 15 feeds High or Low level of the control signal to the boost circuit 14. The boost circuit 14 outputs the boosted voltage in response to, for example, the High level of the control signal, and stops the operation in response to the Low level of the control signal. The rise-rate adjustment resistor 13 controls the rise in the gate voltage of the output MOS11. Specifically, the rise-rate adjustment resistor 13 adjusts the time for the voltage between the gate and source terminals of the output MOS11 to exceed the threshold voltage Vt1 after the boost circuit 14 outputs the boosted voltage. The rise-rate adjustment resistor 13 determines the slew rate during the turn-on transition.

The gate terminal of the output MOS11 is further connected to the output terminal OUT via a plurality of the slew rate adjustment circuit 16 (hereinafter referred to as off-rate adjustment circuit, either). A plurality of the slew rate adjustment circuits configures the slew rate adjustment block which adjusts the slew rate during the turn-off transition. Each off-rate adjustment circuit 16 is configured as a constant current source. Each off-rate adjustment circuit 16 generates a current based on the activation signal fed from the state determination circuit 12. Each current value (capability) of the off-rate adjustment circuit 16 is set to have different value from each other, and each off-rate adjustment circuit 16 decreases the gate voltage of the output MOS11 at a respective predetermined rate.

The state determination circuit 12 detects whether or not there is an excessive current flowing though the output MOS11, based on, for example, the voltage difference between the power source terminal Vin and the output terminal OUT. If the state determination circuit 12 detects the excessive current state on the output MOS11, the signal that forces to turn off the output MOS11 is supplied to the control signal input circuit 15. Further, when the control signal from the control signal input circuit 15 ramps down to Low level, the state determination circuit 12 selects at least one off-rate adjustment circuit 16 to be activated, and sends the activation signal(s) to the selected off-rate adjustment circuit 16. That is, the state determination circuit 12 functions as a load current detecting block that detects the load current, and outputs the signal based on the result of the detection to the slew rate adjustment block.

Upon receiving the external signal by which the output MOS11 is turned on, the control signal from the control signal input circuit 15 increases stepwise from Low level to High level. The boost circuit 14 starts its operation based on the control signal having been turned to High level, and feeds the boosted signal to the gate terminal of the output MOS11 via the rise-rate adjustment resistor 13. The boosting control of the gate voltage of the output MOS11 is made by the rise-rate adjustment resistor 13. When the voltage difference between the gate and source terminals exceeds the threshold Vt, the output MOS11 is turned on and the power to the load 17 is supplied.

On the other hand, upon receiving the external signal by which the output MOS11 is turned off or receiving the off-signal from the state determination circuit 12 which has detected the excessive current state, the control signal from the control signal input circuit 15 decreases stepwise from High level to Low level. When the control signal ramps down to Low level, the boost circuit 14 stops the operation. The state determination circuit 12 determines the current value across the output MOS11 based on, for example, the voltage difference between the power source terminal Vin and the output terminal OUT. The state determination circuit 12 sends the activation signal(s) to the off-rate adjustment circuit 16 to be activated.

For example, if no excessive current is flowing through, the out put MOS11 at the time of ramping down of the control signals the state determination circuit 12 selects an off-rate adjustment circuit 16 and sends the activation signal. In this case, the selected off-rate adjustment circuit 16 is such that it has a lower current capability and takes longer time to decrease the gate voltage of the output MOS11. As mentioned above, if there is no excessive current flowing though the output MOS11 at the time of ramping down of the control signal, the state determination circuit 12 selects the low slew rate for the turn-off transition to maintain the stable operation of the circuit. On the other hand, if there is an excessive current flowing though the output MOS11 at the time of ramping down of the control signal, the state determination circuit 12 selects other off-rate circuit 16 from the plurality of them and sends the activation signal (s). In this case, the selected off-rate adjustment circuit 16 is such that it has a higher current capability and takes shorter time to decrease the gate voltage of the output MOS11. Otherwise, the state determination circuit 12 may send the activation signals to all the off-rate adjustment circuits to select the highest slew rate for the turn-off transition. If there is an excessive current flowing through the output MOS11 at the time of ramping down of the control signal, the state determination circuit 12 starts protecting the output MOS11. The gate voltage of the output MOS11 is lowered at a speed corresponding to the current capability of the activated off-rate adjustment circuit 16, then the output MOS11 is turned off and the power to the load 17 is shut down.

Figure 2:
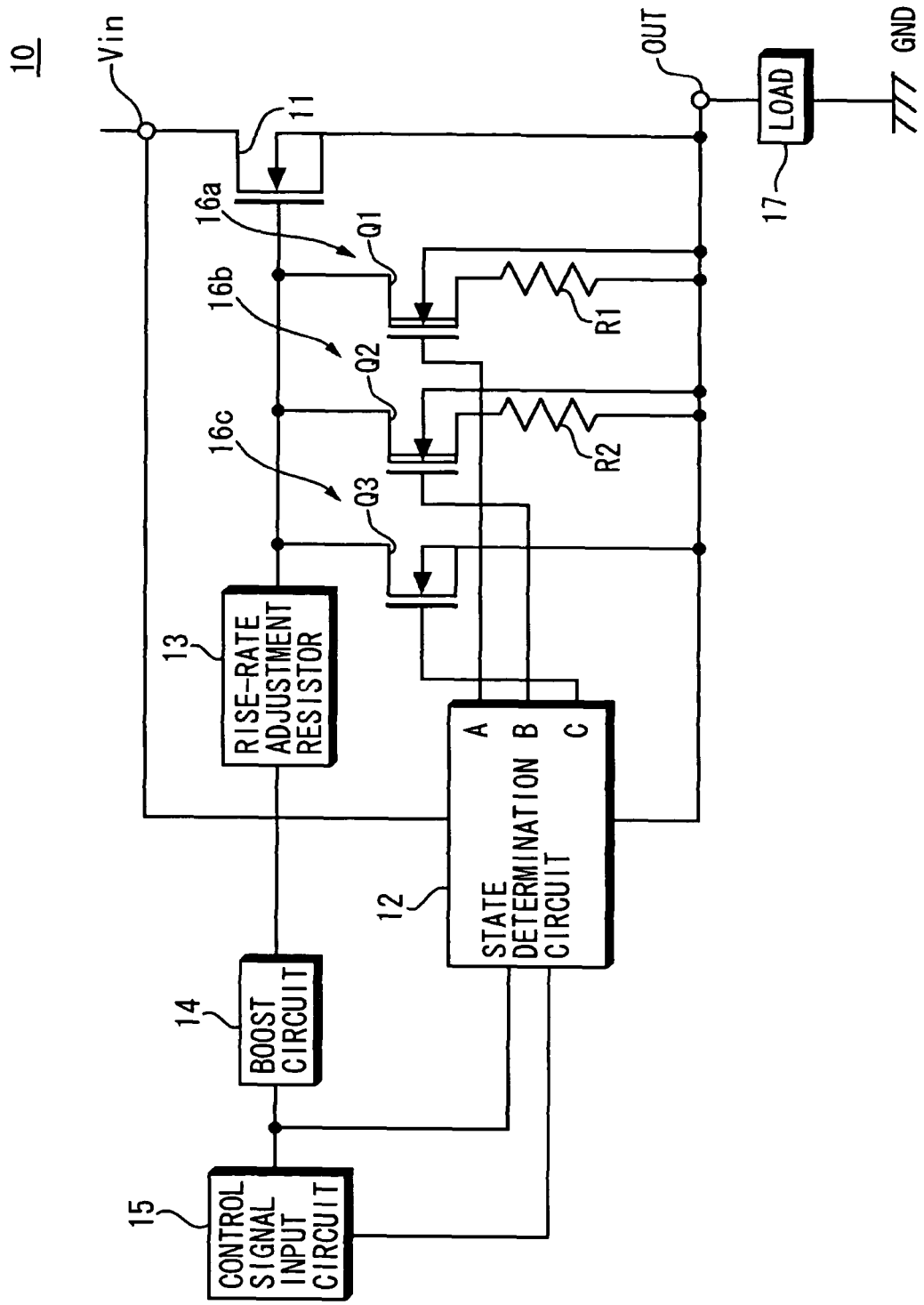
FIG. 2 is a circuit diagram illustrating an embodiment of the off-rate adjustment circuit 16 of FIG. 1 therewith.
Figure 3:
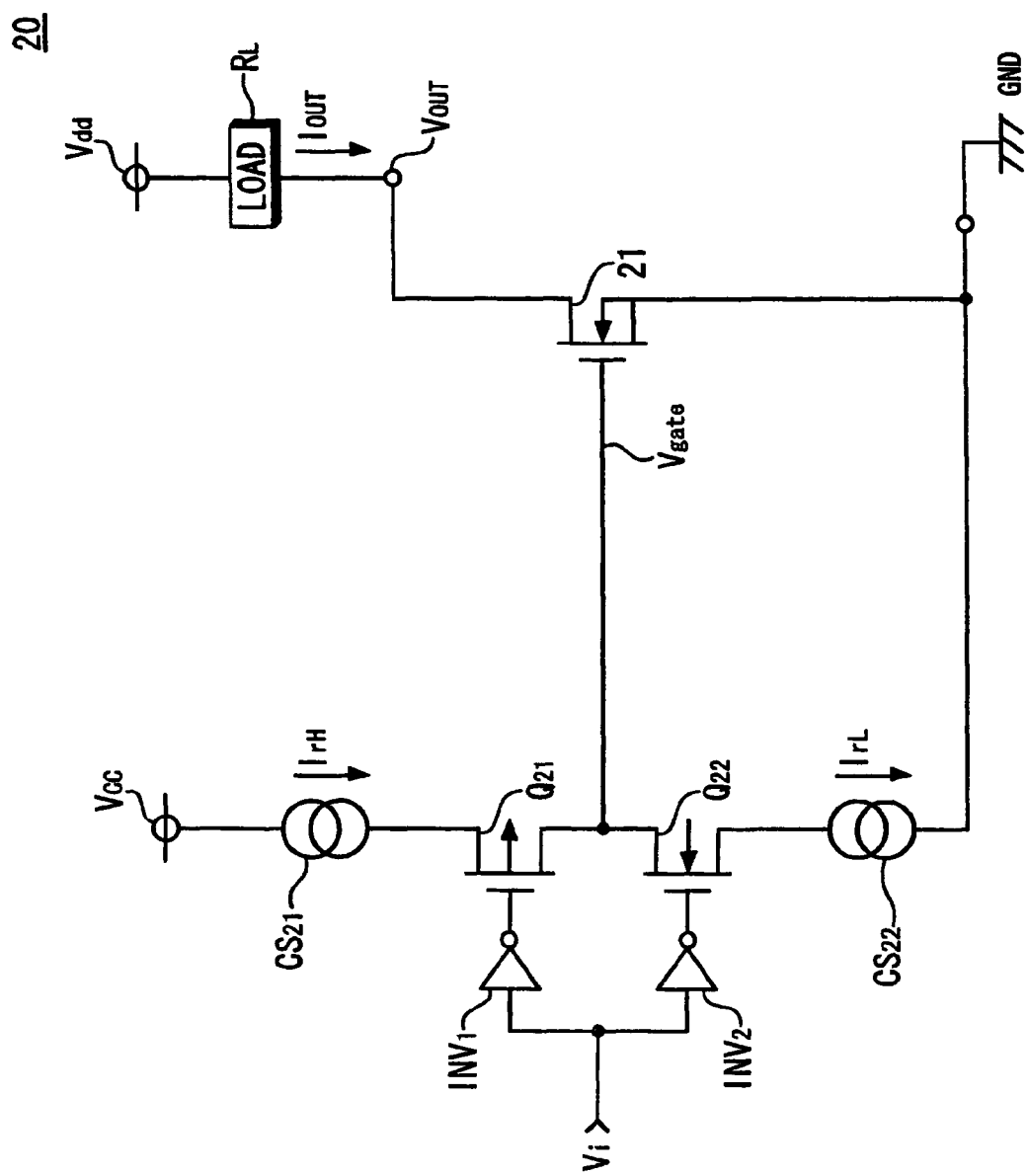
FIG. 3 is a circuit diagram showing the prior art output circuit.

FIG. 2 shows FIG. 1 with examples of the off-rate adjustment circuit 16. In this embodiment, the first off-rate adjustment circuit 16a comprises an N-cannel depletion-type transistor Q1 (discharging transistor) and a resistor R1. The drain terminal of the transistor Q1 is connected to the gate terminal of the output MOS11, and the source terminal is connected to the output terminal OUT via the resistor R1. The gate terminal of the transistor Q1 is fed with the activation signal (A) from the state determination circuit 12, the back-gate terminal is connected to the output terminal OUT.

The second off-rate adjustment circuit 16b comprises an N-channel depletion-type transistor Q2 (discharging transistor) whose current capability is higher than the transistor Q1, and a resistor R2 whose resistance is smaller than the resistor R1. The drain terminal of the transistor Q2 is connected to the gate terminal of the output MOS11, and the source terminal is connected to the output terminal OUT via the resistor R2. The gate terminal of the transistor Q2 is fed with the activation signal (B) from the state determination circuit 12, the back-gate terminal is connected to the output terminal OUT. The third off-rate adjustment circuit 16c comprises an N-channel enhancement-type transistor Q3 (discharging transistor) whose current capability is higher than the transistors Q1 and Q2, and whose drain and source terminals are connected to the gate terminal of the output MOS11 and the output terminal OUT respectively.

The first off-rate adjustment circuit 16a is activated when the current on the output MOS11 is in normal value so that a short fall time is not required. In view of a higher priority to the stability of the circuit operation, a low slew rate is set as the slew rate during the turn-off transition when the first off-rate adjustment circuit 16a is activated. The third off-rate adjustment circuit 16c is activated when the excessive current is flowing through the output MOS11 and a short fall time is required. In view of a higher priority to the protection of the output MOS11, a high slew rate is set as the slew rate during the turn-off transition when the third off-rate adjustment circuit 16c is activated.

The third off-rate adjustment circuit 16c is activated when the current on the output MOS11 is larger than the normal value but smaller than the excessive value and the required fall time is shorter than that in normal operation but not shorter than that in the excessive current state. In view of ensuring both the stability of the circuit operation and the protection for the output MOS11, the set slew rate during the turn-off transition of the second off-rate adjustment circuit 16b is higher than that of the first off-rate adjustment circuit 16a but lower than that of the third off-rate adjustment circuit 16c.

If the current across the output MOS11 is in normal value, after the control signal input circuit 15 shifts the output control signal to Low level based on the external signal, the state determination circuit 12 outputs the activation signal (A) that activates the first off-rate adjustment circuit 16a. In the off-rate adjustment circuit 16a which is fed with the activation signal (A), the gate voltage of the transistor Q1 is boosted to the power source voltage, by which the transistor Q1 is turned on. The gate voltage of the output MOS11 is discharged via the transistor Q1 and resistor R1 at a corresponding speed to the current capability of the transistor Q1, and then the output MOS11 is turned off.

If the current across the output MOS11 is larger than the normal value and smaller than the excessive value, after the control signal input circuit 15 shifts the output control signal to Low level based on the external signal, the state determination circuit 12 outputs the activation signal (B) that activates the second off-rate adjustment circuit 16b. In the off-rate adjustment circuit 16b which is fed with the activation signal (B), the gate voltage of the transistor Q2 is boosted to the power source voltage, by which the transistor Q2 is turned on. The gate voltage of the output MOS11 is discharged via the transistor Q2 and resistor R2 at a corresponding speed to the current capability of the transistor Q2, and then the output MOS11 is turned off. In this case, a higher discharge speed and a shorter fall time of the output MOS11 are obtained, compared with the case where the first off-rate adjustment circuit 16a is activated.

If the excessive current flows through the output MOS11, the state determination circuit 12 sends an off-signal to the control signal input circuit 15, and the control signal input circuit 15 shifts the output control signal to Low level based on the received off-signal. At the same time, the state determination circuit 12 outputs the activation signal (C) to the third off-rate adjustment circuit 16c. In the off-rate adjustment circuit 16c which is fed with the activation signal (C), the gate voltage of the transistor Q3 is boosted to the power source voltage. This turns the transistor Q3 on, by which the gate voltage of the output MOS11 is instantaneously discharged, and then the output MOS11 is rapidly turned off.

In this embodiment, as described above, the state determination circuit 12 selects the slew rate adjustment circuit 16 to be activated from a plurality of them according to the current value on the output MOS11 during the turn-off transition of the output MOS11. Thus, if the current across the output MOS11 is in normal value, a lower slew rate during the turn-off transition can be selected, which allows the improvement of the stability of the circuit operation, and if the current value on the output MOS11 is larger than the normal value, a higher slew rate during the turn-off transition can be set, which allows the effective protection of the output MOS11. In particular, when the excessive current is on the output MOS11, the rapid turn-off of the output MOS11 allows the reduction of the stress corresponding to the energy that may be applied until the output MOS11 is turned off, namely, which allows the widened margin to the forward safe operation area of the output MOS11, so that the destruction of the output MOS11 is prevented.

It is noted that, in the embodiment above, while the depletion-type transistors are employed as the transistors for the first and second off-rate adjustment circuits 16a and 16b, the enhancement type transistor can also be employed. In addition, when the state determination circuit 12 outputs the activation signal (B) to the second off-rate adjustment circuit 16b, it is also preferable to simultaneously output the activation signal (A) to the first off-rate adjustment circuit 16a to activate both off-rate adjustment circuits 16a and 16b. Similarly, when the state determination circuit 12 outputs the activation signal (C) to the third off-rate adjustment circuit 16c, it is also preferable to simultaneously output the activation signals (A) and (B) to the first and second off-rate adjustment circuits 16a and 16b to activate all the off-rate adjustment circuits 16a, 16b and 16c.

While the present invention is explained based on the preferable embodiments, the output circuit of the present invention is not limited by the above-described embodiments, and any embodiment with various modification or alteration therewith shall be included in the scope of the present invention.

From the invention this described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An output circuit, comprising:
an output transistor supplying a load current to a load;
a control signal input circuit supplying a switching signal to turn on/off the output transistor in response to an external switching signal applied to the control signal input circuit;
a load current detecting block detecting a current level of a current flowing through the output transistor;
a first off-rate adjustment circuit coupled between a gate terminal and a source terminal of the output transistor and including a depression-type MOS transistor, the depression-type MOS transistor having a gate terminal coupled with a first output terminal of the load current detecting block; and a second off-rate adjustment circuit coupled between the gate terminal and the source terminal of the output transistor and including an enhancement-type MOS transistor, the enhancement-type MOS transistor having a gate terminal coupled with a second output terminal of the load current detecting block, wherein the load current detecting block outputs a first activation signal, which is dependent on the switching signal to turn off the output transistor, at the first output terminal to turn on the depression-type MOS transistor when the load current detecting block detects a first current level flows through the output transistor, and the load current detecting block outputs a second activation signal, which is independent from the external switching signal, to the second output terminal to turn on the enhancement-type MOS transistor when the load current detecting block detects a second current level larger than the first current level flows through the output transistor.

2. The output circuit according to claim 1, wherein the control signal input circuit supplies the switching signal to the load current detecting block in response to the external switching signal.

3. The output circuit according to claim 2, wherein the load current detecting block supplies an OFF-signal to the control signal input circuit when the load current detecting block detects the second current level, the control signal input circuit changes the switching signal to turn off the output transistor even when the external switching signal indicates a state to turn on the output transistor.

4. The output circuit according to claim 1, wherein the first off-rate adjustment circuit further includes a resistor connected in series with the depression-type MOS transistor.

5. The output circuit according to claim 1, wherein a drain terminal of the output transistor is connected to a power source terminal, and the source terminal of the output transistor is connected to an output terminal for connecting with the load.

6. The output circuit according to claim 5, further comprising:

a boost circuit coupled between the control signal input circuit and the gate terminal of the output transistor, the boost circuit outputting a boosted voltage higher than a voltage of the power source terminal in response to the switching signal to turn on the output transistor.

7. The output circuit according to claim 6, further comprising a rise-rate adjustment resistor coupled between the boost circuit and the gate terminal of the output transistor.

8. The output circuit according to claim 7, wherein the first and second off-rate adjustment circuits are coupled between a node between the rise-rate adjustment resistor and the gate terminal of the output transistor and the source terminal of the output transistor.

9. The output circuit according to claim 1, wherein the depression-type MOS transistor is defined as a first depression-type MOS transistor, the output circuit further comprising:

a third off-rate adjustment circuit coupled between the gate terminal and the source terminal of the output transistor and including a second depression-type MOS transistor, the second depression-type MOS transistor having a gate terminal coupled with a third output terminal of the load current detecting block, wherein the load current detecting block outputs a third activation signal to the third output terminal to turn on the second depression-type MOS transistor when the load current detecting block detects a third current level larger than the first current level and smaller than the second current level flows through the output transistor.

10. The output circuit according to claim 9, wherein the resistor in the first off-rate adjustment circuit is defined as a first resistor, the third off-rate adjustment circuit further includes a second resistor connected in series with the second depression-type MOS transistor.

11. The output circuit according to claim 9, further comprising:

a boost circuit coupled between the control signal input circuit and the gate terminal of the output transistor, the boost circuit outputting a boosted voltage higher than a voltage of the power source terminal in response to the switching signal to turn on the output transistor; and a rise-rate adjustment resistor coupled between the boost circuit and the gate terminal of the output transistor, wherein the first to third off-rate adjustment circuits are coupled between a node between the rise-rate adjustment resistor and the gate terminal of the output transistor and the source terminal of the output transistor.

* * * * *